(12) United States Patent
Bansal et al.

(10) Patent No.: US 10,148,284 B2
(45) Date of Patent: Dec. 4, 2018

(54) APPARATUS AND METHOD FOR WIRED DATA COMMUNICATION

(71) Applicant: Avago Technologies International Sales Pte. Limited, Singapore (SG)

(72) Inventors: Ankit Sajjan Kumar Bansal, San Jose, CA (US); Eric A. Baden, Saratoga, CA (US)

(73) Assignee: Avago Technologies International Sales Pte. Limited, Singapore (SG)

(*) Notice: Subject to any disclaimer, the term of this patent is extended or adjusted under 35 U.S.C. 154(b) by 131 days.

(21) Appl. No.: 15/189,696

(22) Filed: Jun. 22, 2016

(65) Prior Publication Data

US 2016/0380647 A1    Dec. 29, 2016

Related U.S. Application Data

(60) Provisional application No. 62/184,579, filed on Jun. 25, 2015.

(51) Int. Cl.
| | | |
|---|---|---|
| *H04L 12/40* | (2006.01) | |
| *H03M 7/30* | (2006.01) | |
| *H04L 12/413* | (2006.01) | |
| *H03M 5/14* | (2006.01) | |
| *H04L 12/70* | (2013.01) | |

(52) U.S. Cl.
CPC .............. *H03M 7/30* (2013.01); *H03M 5/145* (2013.01); *H04L 12/413* (2013.01); *H04L 2012/5652* (2013.01)

(58) Field of Classification Search
None
See application file for complete search history.

(56) References Cited

U.S. PATENT DOCUMENTS

| 9,130,695 | B1* | 9/2015 | Dalmia | H04L 12/4013 |
|---|---|---|---|---|
| 2009/0169218 | A1* | 7/2009 | Nonaka | H04J 3/07 |
| | | | | 398/154 |
| 2009/0189794 | A1* | 7/2009 | Baumer | G06Q 30/02 |
| | | | | 341/95 |
| 2011/0013690 | A1* | 1/2011 | Kobayashi | H04J 3/1658 |
| | | | | 375/240 |
| 2011/0216782 | A1* | 9/2011 | Nakajima | H04L 1/0072 |
| | | | | 370/474 |
| 2015/0022098 | A1* | 1/2015 | Knapp | G09G 3/2003 |
| | | | | 315/161 |

* cited by examiner

*Primary Examiner* — Kibrom T Hailu
(74) *Attorney, Agent, or Firm* — Sterne, Kessler, Goldstein & Fox P.L.L.C.

(57) ABSTRACT

The present disclosure describes a wired communication device having media access control (MAC) circuitry and physical layer (PHY) circuitry. The MAC circuitry frames one or more data packets in accordance with a wired communication standard or protocol to provide one or more data frames. The one or more data frames include one or more packets that are separated by interpacket gaps (IPGs). The MAC circuitry selectively choses a duration of the IPGs to maintain an average IPG duration. The PHY circuitry encodes the one or more data frames in accordance with a line coding scheme that is efficiently represents different possible combinations for types of characters present in the one or more data frames.

20 Claims, 5 Drawing Sheets

APPARATUS AND METHOD FOR WIRED DATA COMMUNICATION

CROSS-REFERENCE TO RELATED APPLICATIONS

The present application claims the benefit of U.S. Provisional Patent Appl. No. 62/184,579, filed Jun. 25, 2015, which is incorporated herein by reference in its entirety.

BACKGROUND

Field of Disclosure

The present disclosure relates generally to wired communication, and including framing and encoding.

Related Art

Ethernet is a family of computer networking technologies commonly used in local area networks (LANs) and metropolitan area networks (MANs). Ethernet was originally designed to use coaxial cable as a shared medium; however, more recent Ethernet variants use twisted pair and fiber optic links in conjunction with hubs or switches. Ethernet technology has evolved to meet new bandwidth and market requirements. In addition to computers, Ethernet is now used to interconnect appliances and other personal devices. It is used in industrial applications and is quickly replacing legacy data transmission systems in the world's telecommunications networks.

BRIEF DESCRIPTION OF THE DRAWINGS/FIGURES

Embodiments of the disclosure are described with reference to the accompanying drawings. In the drawings, like reference numbers indicate identical or functionally similar elements. Additionally, the left most digit(s) of a reference number identifies the drawing in which the reference number first appears. In the accompanying drawings.

The disclosure will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE DISCLOSURE

Overview

The present disclosure describes a wired communication device having media access control (MAC) circuitry and physical layer (PHY) circuitry. The MAC circuitry frames one or more data packets in accordance with a wired communication standard or protocol to provide one or more data frames. The one or more data frames include one or more packets that are separated by interpacket gaps (IPGs). The MAC circuitry selectively choses a duration of the IPGs to maintain a constant data rate. The PHY circuitry encodes the one or more data frames in accordance with a line coding scheme that efficiently represents different possible combinations for types of characters present in the one or more data frames.

Exemplary Wired Communication Device

Figure 1:
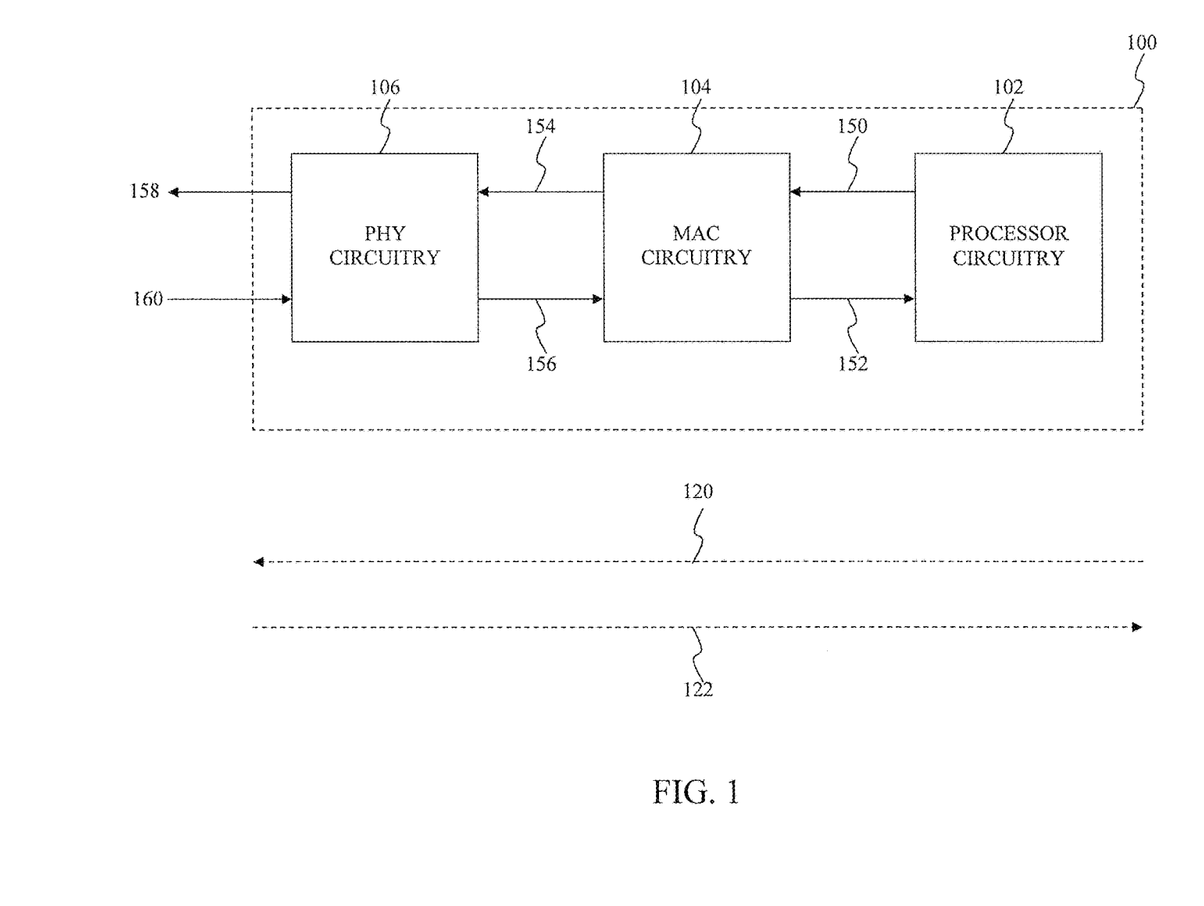
FIG. 1 graphically illustrates a block diagram of an exemplary wired communication device according to an exemplary embodiment of the present disclosure.

FIG. 1 graphically illustrates a block diagram of an exemplary wired communication device according to an exemplary embodiment of the present disclosure. A wired communication device 100 communicates information with one or more wired communication devices over a wired network in accordance with a wired communication standard or protocol. The wired communication device 100 can represent a computing device, such as a personal computing device to provide an example, peripherals, such as a printer, mouse, monitor, keyboard to provide some examples, for the computing device, a set-top box, a cable modem, a networking switch, a networking router, or any other electronic device that is capable of communicating over the wired network that will be apparent to those skilled in the relevant art(s) without departing from the spirit and scope of the present disclosure. The wired network can represent one or more personal area networks (PANs), one or more local area networks (LANs), one or more wide area networks (WANs), and/or any other suitable wired network, such as a telephone network, a cable television, an internet access network, and/or a fiber-optic communication network to provide some examples, that will be apparent to those skilled in the relevant art(s) without departing from the spirit and scope of the present disclosure. The wired communication standard or protocol can include Ethernet as defined in a version of an Institute of Electrical and Electronics Engineers (I.E.E.E.) 802.3 communication protocol, a Power over Ethernet communication protocol, a Point-to-Point Protocol over Ethernet (PPPoE) communication protocol, HomePNA (HPNA) as defined in a version of one of the ITU-T Recommendation G.995 communication protocols, and HomePlug as defined in a version of an Institute of Electrical and Electronics Engineers (I.E.E.E.) 1901 communication protocol, and/or any other suitable wired communication standard or protocol that will be apparent to those skilled in the relevant art(s) without departing from the spirit and scope of the present disclosure.

As illustrated in FIG. 1, the wired communication device 100 includes processor circuitry 102, media access control (MAC) circuitry 104, and physical layer (PHY) circuitry 106. For the purposes of this discussion, the term "circuitry" shall be understood to include an analog circuit, a digital circuit, state machine logic, other structural electronic hardware, or a combination thereof. The term "processor circuitry" shall be understood to be one or more: circuit(s), processor(s), or a combination thereof. A processor can include a microprocessor, a digital signal processor (DSP), or other hardware processor. The processor can be "hard-coded" with instructions to perform corresponding function(s) according to embodiments described herein. Alternatively, the processor can access an internal and/or external memory to retrieve instructions stored in the memory, which when executed by the processor, perform the corresponding function(s) associated with the processor.

The processor circuitry 102 controls overall operation and/or configuration of the wired communication device 100. For example, in a downstream direction 120, the processor circuitry 102 provides one or more data packets 150 to the MAC circuitry 104 for transmission over the wired network. As another example, in an upstream direction 122, the processor circuitry 102 receives one or more data packets 152 from the MAC circuitry 104. In an exemplary embodiment, the wired communication device 100 can be incorporated within or coupled to another electrical device or host device. In this exemplary embodiment, the processor circuitry 102 can receive the one or more data packets 150 from this other electrical device or host device and/or can provide the one or more data packets 152 to this other electrical device or host device. In some situations, the processor circuitry 102 can receive a stream of data from this other electrical device or host device and can packetize this received stream of data into the one or more data packets 150. The processor circuitry 102 can likewise depacketize the one or more data packets 152 received from the MAC circuitry 104 into a stream of data and can provide this stream of data to this other electrical device or host device.

The MAC circuitry 104 represents an interface between the processor circuitry 102 and the PHY circuitry 106. The MAC circuitry 104 manages and maintains communication of the wired communication device 100 by coordinating access to the wired network with the one or more wired communication devices in accordance with the wired communication standard or protocol. In the downstream direction 120, the MAC circuitry 104 encapsulates or frames the one or more data packets 150 in accordance with the wired communication standard or protocol to the provide one or more data frames 154 to the PHY circuitry 106. The MAC circuitry 104 decapsulates or de-frames one or more data frames 156 as received from the PHY circuitry 106 in accordance with the wired communication standard or protocol to provide the one or more data packets 152 in the upstream direction 122.

The PHY circuitry 106 represents an interface between the MAC circuitry 104 and the one or more wired communication devices of the wired network. The PHY circuitry 106 implements electrical and physical specifications such as signal voltage, frequency, to provide some examples, for the wired communication device 100, such a relationship between the wired communication device 100 and a transmission medium to provide an example. Generally, the PHY circuitry 106 encodes, scrambles and/or transcodes the one or more data frames 154 to provide one or more transmission signals 158 for transmission over the wired network in the downstream direction 120. The PHY circuitry 106 establishes and/or terminates one or more connections to the transmission medium to transmit the one or more transmission signals 158 in the downstream direction 120, where the one or more transmission signals 158 represent the one or more data frames 154. Additionally, the PHY circuitry 106 decodes, descrambles and/or transcodes one or more reception signals 160 as received over the transmission medium to provide the one or more data frames 156 in the upstream direction 122. The PHY circuitry 106 establishes and/or terminates one or more connections to the transmission medium to receive the one or more reception signals 160 in the upstream direction 122.

Conventional Ethernet Frame of the Wired Communication Device

Figure 2:
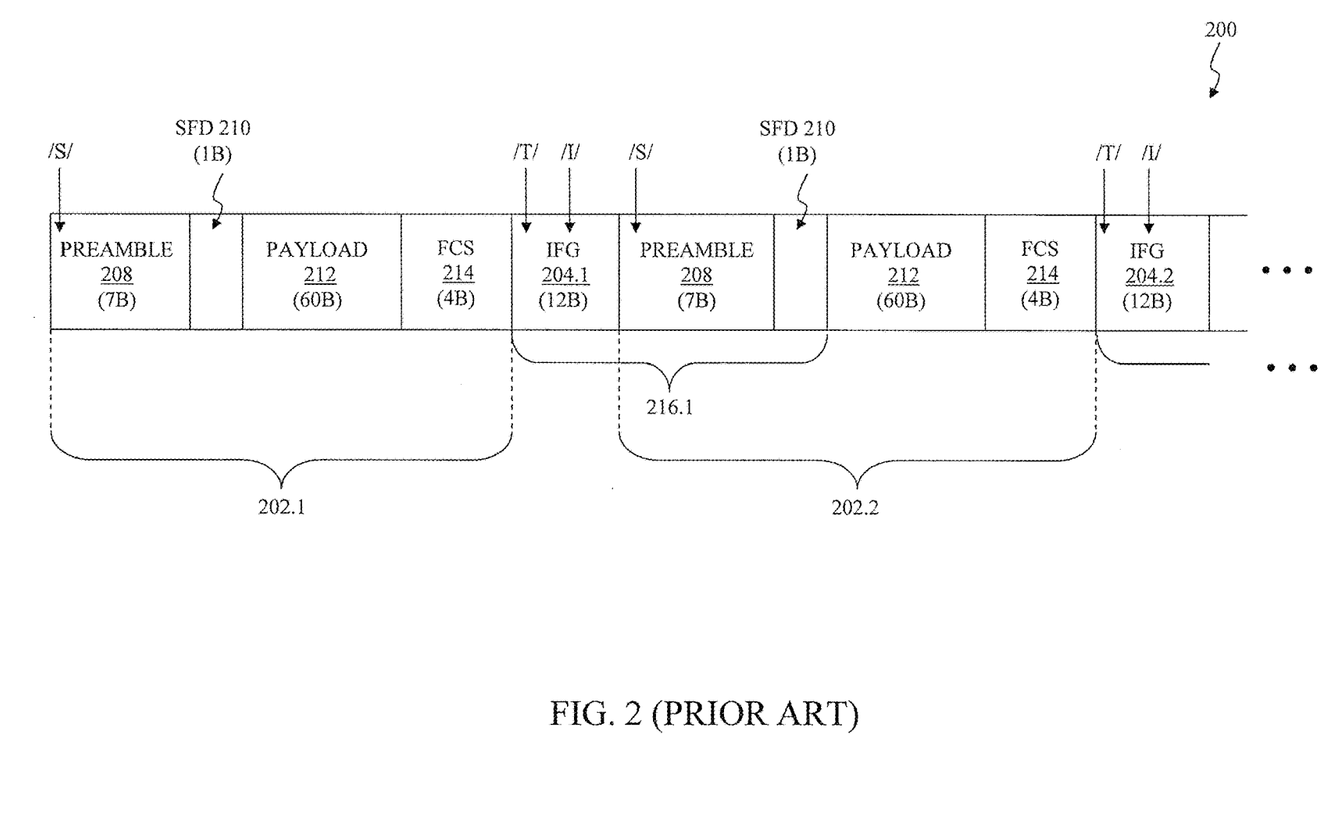
FIG. 2 illustrates a conventional Ethernet frame that can be implemented within the wired communication device according to an exemplary embodiment of the present disclosure.

FIG. 2 illustrates a conventional Ethernet frame that can be implemented within the wired communication device according to an exemplary embodiment of the present disclosure. Media access control (MAC) circuitry, such as the MAC circuitry 104 to provide an example, of a wired communication device, such as the wired communication device 100 to provide an example, can frame one or more data packets, such as the one or more data packets 150 to provide an example, and/or can de-frame one or more data frames, such as the one or more data frames 156 to provide an example, in accordance with the wired communication standard or protocol. As illustrated in FIG. 2, a conventional Ethernet frame structure 200 includes conventional Ethernet frames 202.1 through 202.n, each of the conventional Ethernet frames 202.1 through 202.n being separated by a conventional interframe gap (IFG) from among conventional IFGs 204.1 through 204.n.

As illustrated in FIG. 2, the conventional Ethernet frames 202.1 through 202.n include a Preamble Field 208, a start of packet delimiter (SFD) Field 210, a Payload 212, and a Frame Check Sequence (FCS) Field 214. The Preamble Field 208 represents an alternating pattern of logical zeros and logical ones which allows one or more communication devices within the wired network, such as the wired communication device 100 and/or the one or more wired communication devices as discussed above in FIG. 1, to synchronize their various clocking mechanisms to the conventional Ethernet frames 202.1 through 202.n. Conventionally, the pattern of logical zeros and logical ones of the Preamble Field 208 is seven-bytes in duration. In conventional 10 Gigabit Media Independent Interface (XGMII)/40 Gigabit Media Independent Interface (XLGMII) Reconciliation Sublayer (RS) modes of operation, a first byte of the preamble is converted to a 'Start' character, denoted as /S/ in FIG. 2.

The SFD Field 210 represents a one-byte field to designate a transition between the Preamble Field 208 and the Payload 212. For example, the SFD Field 210 indicates an end to the Preamble Field 208 and a start of the Payload 212. The Payload 212 represents a variable field for the transmission of information among the wired network. Although the Payload 212 is shown as being a sixty-byte field in FIG. 2, the Payload 212 can vary. The Payload 212 can include voice and/or data communications, such as text, audio, images, animation, video and/or interactive content to provide some examples, to be communicated over the wired network. The FCS Field 214 follows the Payload 212 and represents a four-byte cyclic redundancy check (CRC) field for detecting corrupted data within the conventional Ethernet frames 202.1 through 202.n.

Referring back the discussion above, the conventional IFGs 204.1 through 204.n separate the conventional Ethernet frames 202.1 through 202.n. The conventional IFGs 204.1 through 204.n represent idle periods for a duration of twelve-bytes. In an exemplary embodiment, the conventional IFGs 204.1 through 204.n represent a duration of twelve-bytes for communicating 'Idle' characters, denoted as /I/ in FIG. 2. As illustrated in FIG. 2, the conventional IFGs 204.1 through 204.n and the Preamble Fields 208 and the SFDs Field 210 for the conventional Ethernet frames 202.1 through 202.n can be referred to as conventional interpacket gaps (IPGs) 216.1 through 216.n. The IPGs represent a twenty-byte separation between the Payloads 212 of the conventional Ethernet frames 202.1 through 202.n. In the conventional XGMII/XLGMII RS modes of operation, a first byte of the conventional IFGs 204.1 through 204.n is converted to a 'Terminate' character, denoted as /T/ in FIG. 2, to indicate an end of the Payload 212.

Ethernet Frame of the Wired Communication Device

Figure 3:
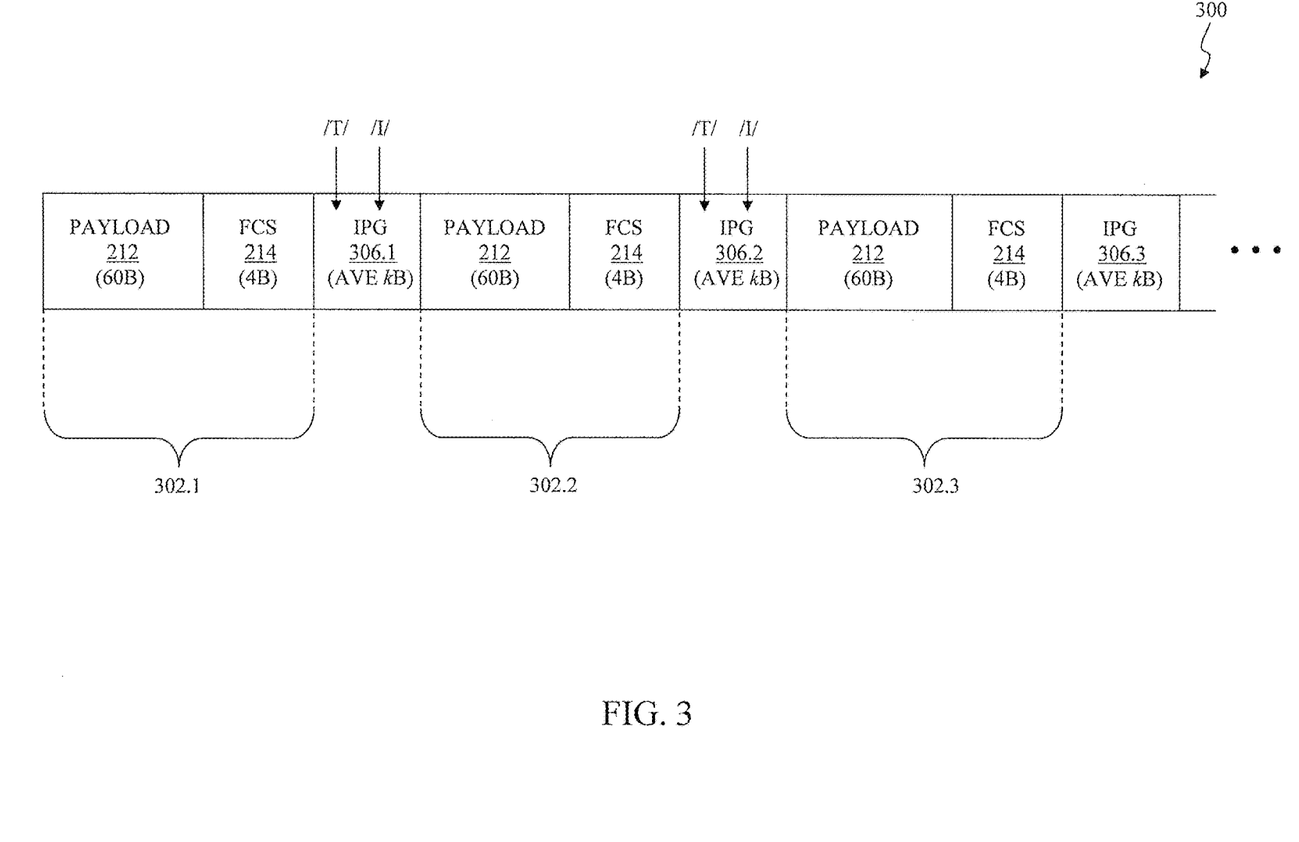
FIG. 3 illustrates an exemplary Ethernet frame that can be implemented within the wired communication device according to an exemplary embodiment of the present disclosure.

Ethernet frames of the present disclosure efficiently adapt the conventional Ethernet frame structure 200 to provide for higher frame rates within the wired network by shortening the conventional IFGs 204.1 through 204.n. For example, IFGs between the Ethernet frames of the present disclosure are efficiently adapted to provide for higher frame rates within the wired network. FIG. 3 illustrates an exemplary Ethernet frame that can be implemented within the wired communication device according to an exemplary embodiment of the present disclosure. Media access control (MAC) circuitry, such as the MAC circuitry 104 to provide an example, of a wired communication device, such as the wired communication device 100 to provide an example, can frame one or more data packets, such as the one or more data packets 150 to provide an example, in accordance with an Ethernet communication standard or protocol such as a version of an Institute of Electrical and Electronics Engineers (I.E.E.E.) 802.3 communication protocol, a Power over Ethernet communication protocol, or a Point-to-Point Protocol over Ethernet (PPPoE) communication protocol to provide some examples. The MAC circuitry can likewise de frame one or more data frames, such as the one or more data frames 156 to provide an example, in accordance with the Ethernet communication standard or protocol. As illustrated in FIG. 3, an Ethernet frame structure 300 includes Ethernet frames 302.1 through 302.n, each of the Ethernet frames 302.1 through 302.n being separated by an IPG from among IPGs 306.1 through 306.n. The Ethernet frame structure 300 illustrated in FIG. 3 represents a generalized Ethernet frame structure. Those skilled in the relevant art(s) will recognize that other Fields, such as an Ethernet Media Access Control (MAC) Destination Address Field, an Ethernet MAC Source Address Field, and/or an Ethernet Type Field to provide some examples, are possible without departing from the spirit and scope of the present disclosure.

As illustrated in FIG. 2 above, the conventional Ethernet frames 202.1 through 202.n include the Payload 212 and the FCS Field 214. However, in the exemplary embodiment illustrated in FIG. 3, the Preamble Field 208 and the SFD Field 210 have been removed from the Ethernet frames 302.1 through 302.n. As a consequence, the Preamble Field 208 is no longer available for the one or more communication devices within the wired network, such as the wired communication device 100 and/or the one or more wired communication devices as discussed above in FIG. 1, to synchronize their various clocking mechanisms to the Ethernet frames 302.1 through 302.n. In an exemplary embodiment, in the XGMII/XLGMII RS modes of operation, the removal of the Preamble Field 208 consequentially removes the 'Start' characters, which are present in the conventional Ethernet frames 202.1 through 202.n, from the Ethernet frames 302.1 through 302.n. In this situation, the MAC circuitry and PHY circuitry, such as the PHY circuitry 106 to provide an example, implicitly communicate the start of the Payload 212 using the IPGs 306.1 through 306.n. For example in the downstream direction 120, the MAC circuitry frames the Payload 212 into the Ethernet frames 302.1 through 302.n. As part of this framing, the MAC circuitry communicates 'control type' characters, such as the 'Idle' characters, the 'Terminate' characters, 'Error' characters, and/or 'Ordered Set' characters to provide some examples, to the PHY circuitry during the IPGs 306.1 through 306.n. Thereafter, in this example, the PHY circuitry determines a start of the Payload 212 when the MAC circuitry transitions from 'control type' characters to 'data type' characters so as to determine an end of one of the IPGs 306.1 through 306.n and the beginning of a payload 212 corresponding to the one of the IPGs 306.1 through 306.n. As another example, in the upstream direction 122, the PHY circuitry can decode the Ethernet frame structure 300 to locate the 'control type' characters representing the IPGs 306.1 through 306.n. Thereafter, in this example, the PHY circuitry determines the start of the Payload 212 when the Ethernet frame structure 300 transitions from the 'control type' characters to the 'data type' characters.

Referring back the discussion above, the IPGs 306.1 through 306.n separate the Ethernet frames 302.1 through 302.n. As illustrated in FIG. 3, the MAC circuitry selectively choses the IPGs 306.1 through 306.n to maintain an average duration of k-bytes to maintain a constant data rate. In an exemplary embodiment, the average duration is four-bytes. In some situations, durations of the IPGs 306.1 through 306.n can differ from one another. For example, one or more first durations of one or more first IPGs from among the IPGs 306.1 through 306.n can be greater than the average duration of k-bytes and one or more second durations of one or more second IPGs from among the IPGs 306.1 through 306.n can be less than the average duration of k-bytes such that an average of the one or more first durations and the one or more second durations is approximately k-bytes, namely the average duration of k-bytes. In other words, the conventional IFGs 204.1 through 204.n conventionally include twelve-bytes of the 'Idle' characters. As illustrated in FIG. 3, the MAC circuitry adjusts this average duration from twelve-bytes to be k-bytes, such as four-bytes to provide an example, to maintain a constant data rate. In an exemplary embodiment, the durations of the IPGs 306.1 through 306.n can vary from one-byte to seven-bytes to provide a deficit idle count (DIC) of +/− three-bytes to provide an example. The DIC represents the number of bytes that the IPGs 306.1 through 306.n can deviate from the average duration of k-bytes. As illustrated in FIG. 3, the IPGs 306.1 through 306.n include 'Idle' characters, denoted as /I/ in FIG. 3, over the average duration of k-bytes. In an XGMII mode of operation, a first byte of the IPGs 306.1 through 306.n is converted to a 'Terminate' character, denoted as /T/ in FIG. 3.

Exemplary Framing Operation

Figure 4:
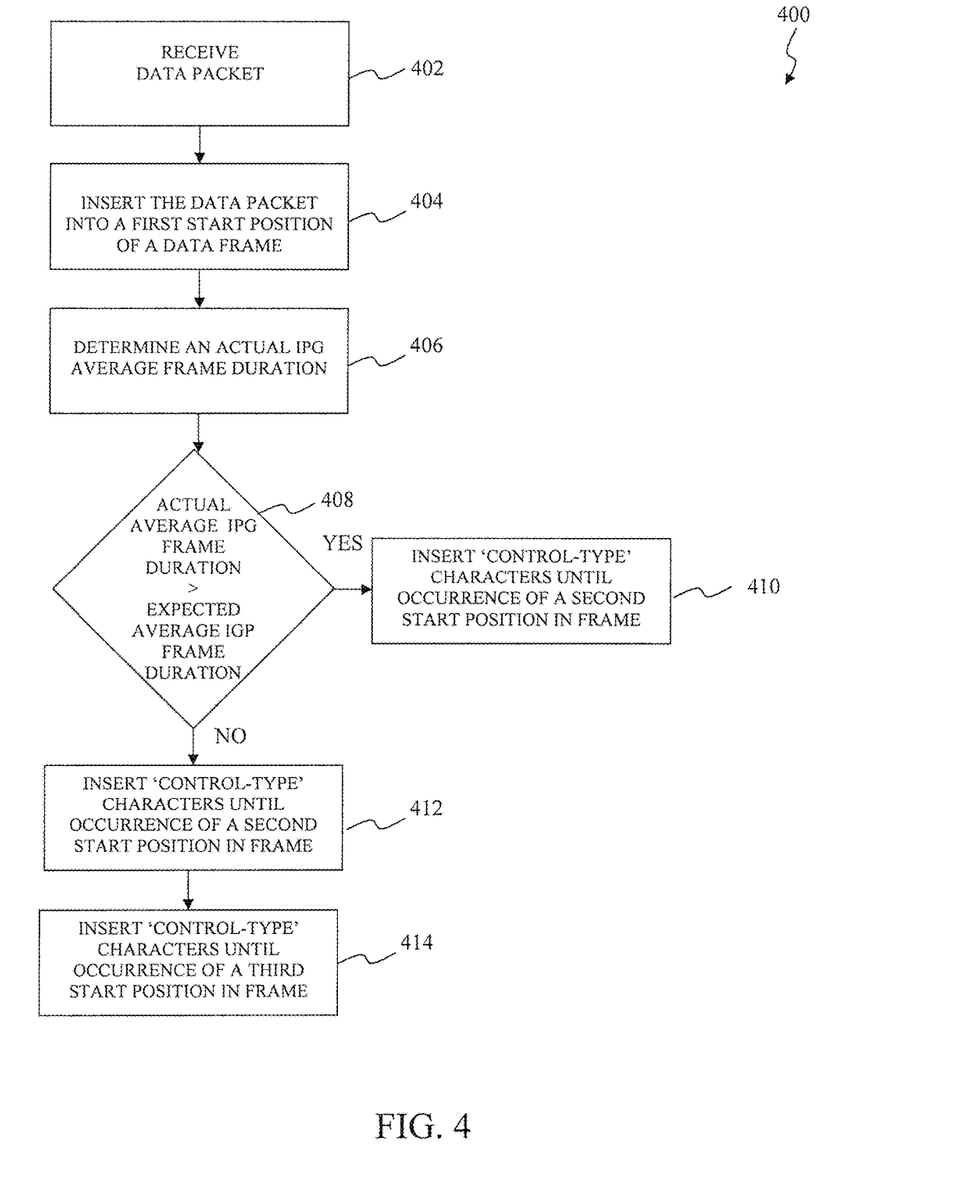
FIG. 4 is a flowchart of exemplary operational steps of an exemplary framing operation that can be implemented within the wired communication device according to an exemplary embodiment of the present disclosure.

FIG. 4 is a flowchart of exemplary operational steps of an exemplary framing operation that can be implemented within the wired communication device according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes an exemplary operational control flow 400 of a network, such as the network 100 to provide an example, in the transmission mode of operation MAC circuitry of a wired communication device, such as the MAC circuitry 104 to provide an example.

At step 402, the operational control flow 400 receives a data packet of information, such as the Payload 212 and its corresponding Sequence (FCS) Field 214 to provide an example.

At step 404, the operational control flow 400 inserts the data packet of information of step 402 into a first start position of a data frame to generate an Ethernet frame, such as one of the Ethernet frames 302.1 through 302.n to provide an example. In an exemplary embodiment, the data frame can be represented by successive sequences of eight-bytes, such as BYTE 0 through BYTE 7. In this exemplary embodiment, the operational control flow 400 inserts the data packet of information of step 402 starting a BYTE 0 or BYTE 4 of a sequence of eight-bytes from among the successive sequences of eight-bytes.

At step 406, the operational control flow 400 determines an actual average IPG duration of bytes between one or more previous data packets of information, such as one or more previous ones of the Ethernet frames 302.1 through 302.n to provide an example, that have been previously inserted into the data frame. For example, the operational control flow 400 averages one or more durations of one or more previous IPGs, such as the one or more of the IPGs 306.1 through 306.n, between the one or more previous Ethernet frames to determine the actual average IPG duration.

At step 408, the operational control flow 400 compares the actual average IPG duration of step 406 with an expected average IPG duration of four-bytes to provide an example. The operational control flow 400 proceeds to step 410 when the actual average IPG duration of step 406 is greater than the expected average IPG duration. Otherwise, the operational control flow 400 proceeds to step 412 when the actual average IPG duration of step 406 is less than the expected average IPG duration.

At step 410, the operational control flow 400 inserts a first 'control-type' character, such as a 'Terminate' character, denoted as /T/ in FIG. 3, into the data frame immediately following the data packet of information of step 402. Thereafter, the operational control flow 400 inserts zero or more second 'control-type' characters, such as one or more 'Idle' characters, denoted as /I/ in FIG. 3, into the data frame until reaching an occurrence of a second start position of the data frame to provide an example. For example, if the data packet of information of step 402 were to end at BYTE 4 of a first sequence of eight-bytes of the successive sequences of eight-bytes, then the operational control flow 400 would insert the first 'control-type' character at BYTE 6 of the first sequence of eight-bytes. Thereafter, the operational control flow 400 would insert a second 'control-type' character at BYTE 7 of the first sequence of eight-bytes. This insertion of the zero or more second 'control-type' characters as described in step 410 can cause the actual average IPG duration of step 406 to decrease to be closer to the expected average IPG duration of step 408, because the total number of 'control type' characters is less then four.

At step 412, the operational control flow 400 inserts the first 'control-type' character into the data frame following the data packet of information of step 402. Thereafter, the operational control flow 400 inserts the zero or more second 'control-type' characters into the data frame until reaching an occurrence of a second start position of the data frame. For example, if the data packet of information of step 402 were to end at BYTE 1 of a first sequence of eight-bytes of the successive sequences of eight-bytes, then the operational control flow 400 would insert the first 'control-type' character at BYTE 2 of the first sequence of eight-bytes and the second 'control-type' character at BYTE 3 of the first sequence of eight-bytes.

At step 414, the operational control flow 400 inserts the one or more second 'control-type' characters into the data frame until reaching an occurrence of a third start position of the data frame. For example, if the data packet of information of step 402 were to end at BYTE 1 of the first sequence of eight-bytes of the successive sequences of eight-bytes, then the operational control flow 400 would insert the first 'control-type' character at BYTE 2 of the first sequence of eight-bytes and the second 'control-type' character at BYTE 3 of the first sequence of eight-bytes as discussed in step 412. Thereafter, the operational control flow 400 inserts zero or more of the second 'control-type' characters at BYTE 4 through BYTE 7 of a second sequence of eight-bytes of the successive sequences of eight-bytes. This insertion of the zero or more second 'control-type' characters as described in step 412 and 414 can cause the actual average IPG duration of step 406 to increase to be closer to the expected average IPG duration of step 408.

Coding of the Ethernet Frames of the Wired Communication Device

As discussed above in FIG. 1, the PHY circuitry 106 can encode, scramble, and/or transcode the one or more data frames 154 to provide one or more transmission signals 158 for transmission over the wired network in the downstream direction 120 and/or can decode, descramble, and/or transcode the one or more reception signals 160 as received over the transmission medium to provide the one or more data frames 156 in the upstream direction 122. Generally, this encoding and/or decoding can be performed in accordance with a line coding scheme such as 8b/10b, 64b/66b, 128b/130b and/or 128b/132b to provide some examples. In an exemplary embodiment, speeds that use 64b/66b encoding would need to use XGMII RS layer to be compatible with the line coding scheme of the present disclosure.

Figure 5:
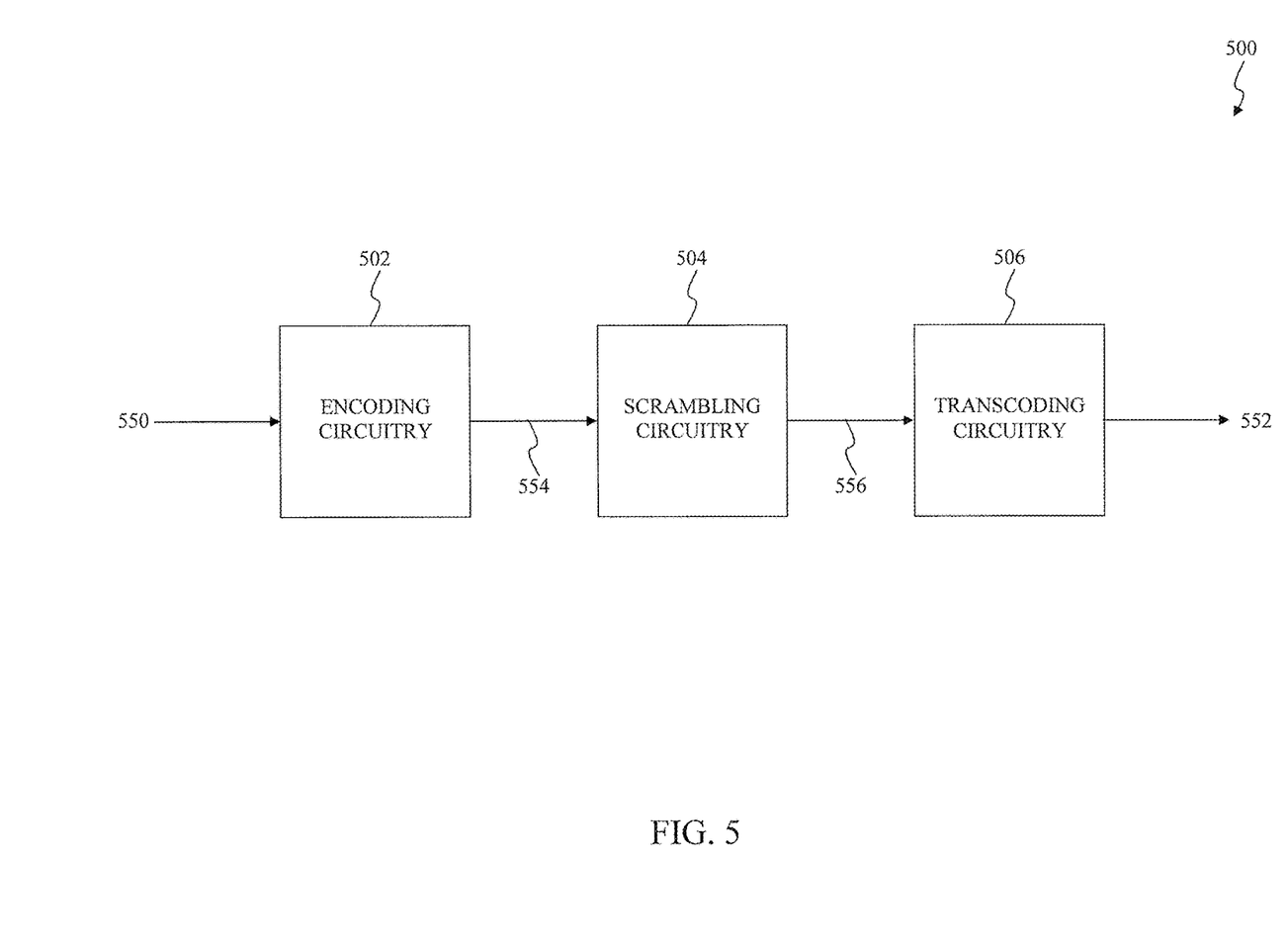
FIG. 5 illustrates exemplary PHY circuitry that can be implemented within the wired communication device according to an exemplary embodiment of the present disclosure.

FIG. 5 illustrates exemplary PHY circuitry that can be implemented within the wired communication device according to an exemplary embodiment of the present disclosure. As illustrated in FIG. 5, PHY circuitry 500 receives one or more input characters 550 from MAC circuitry, such as the MAC circuitry 104 to provide an example, that are framed in accordance with the conventional Ethernet frame structure 200 and/or the Ethernet frame structure 300. The one or more input characters 550 can include a 'data type' character, denoted as $D_X$, or a 'control type' character. The 'control type' character can include a 'start character', denoted as $S_X$, a 'terminate' character', denoted as $T_X$, a 'Ordered Set' character, denoted as $O_X$, or other control-types characters, such an 'idle' character, or an 'error' character, denoted as $C_X$. As illustrated in FIG. 5, the PHY circuitry 500 includes encoding circuitry 502, scrambling circuitry 504, and optional transcoding circuitry 506 to encode, scramble, and/or transcode the one or more input characters 550 to provide one or more output characters 552, such as the one or more transmission signals 158 to provide an example.

The encoding circuitry 502 encodes the one or more input characters 550 from a first number of characters to a larger, second number of characters in accordance with a line coding scheme, such as 8b/10b, 64b/66b, 128b/130b and/or 128b/132b to provide some examples, to provide one or more encoded characters 554. In an exemplary embodiment, each of the one or more input characters 550 can include the 'data type' character or the 'control type' character. Conventionally, a succession of eight characters from among the one or more input characters 550 must be arranged in one of the sixteen combinations of characters as described in the I.E.E.E. 802.3 communication protocol, clause 49, entitled "Physical Coding Sublayer (PCS) for 64b/66b, type 10GBASE-R," (I.E.E.E. 802.3 communication protocol) which is herein incorporated by reference. As described this communication protocol, the sixteen combinations of characters include:

1. $D_0D_1D_2D_3D_4D_5D_6D_7$;
2. $C_0C_1C_2C_3C_4C_5C_6C_7$;
3. $C_0C_1C_2C_3O_4D_5D_6D_7$;
4. $C_0C_1C_2C_3S_4D_5D_6D_7$;
5. $O_0D_1D_2D_3S_4D_5D_6D_7$;
6. $O_0D_1D_2D_3O_4D_5D_6D_7$;

7. $S_0D_1D_2D_3D_4D_5D_6D_7$;
8. $O_0D_1D_2D_3C_4C_5C_6C_7$;
9. $T_0C_1C_2C_3C_4C_5C_6C_7$;
10. $D_0T_1C_2C_3C_4C_5C_6C_7$;
11. $D_0D_1T_2C_3C_4C_5C_6C_7$;
12. $D_0D_1D_2T_3C_4C_5C_6C_7$;
13. $D_0D_1D_2D_3T_4C_5C_6C_7$;
14. $D_0D_1D_2D_3D_4T_5C_6C_7$;
15. $D_0D_1D_2D_3D_4D_5T_6C_7$; and
16. $D_0D_1D_2D_3D_4D_5D_6T_7$.

As described in the I.E.E.E. 802.3 communication protocol, any combination of characters other than one of these sixteen different combinations of characters is invalid or not recognized. The encoding circuitry 502 expands upon the sixteen combinations of characters as described in the I.E.E.E. 802.3 communication protocol to recognize other combinations of characters that are not described in the I.E.E.E. 802.3 communication protocol.

For example, the average duration of the IPGs 306.1 through 306.n of the Ethernet frame structure 300, as discussed above in FIG. 3, can cause a payload 212 of a first Ethernet frame from among the Ethernet frames 302.1 through 302.n to terminate and a payload 212 of a second Ethernet frame from among the Ethernet frames 302.1 through 302.n to start within the succession of eight characters to recognize other combinations of characters, for example, $D_0D_1T_2C_3D_4D_5D_6D_7$, which are not possible under the I.E.E.E. 802.3 communication protocol.

The I.E.E.E. 802.3 communication protocol only allows for the 'Ordered Set' character, denoted as $O_X$, to be located at the first or the fourth character of the succession of eight characters. When the 'Ordered Set' character, denoted as $O_X$, is located at the first character and/or the fourth character of the succession of eight characters, the I.E.E.E. 802.3 communication protocol places restrictions on which 'control-type' characters can be located at the first character and/or the fourth character of the succession of eight characters. For example, the I.E.E.E. 802.3 communication protocol restricts 'data-type' characters from being located at the first character of the succession of eight characters when the 'Ordered Set' character is located at the fourth character of the succession of eight characters. Additionally, in this example, the I.E.E.E. 802.3 communication protocol restricts 'data-type' characters from being located at the fourth character of the succession of eight characters when the 'Ordered Set' character is located at the first character of the succession of eight characters. However, the encoding circuitry 502 can accommodate the 'Ordered Set' character, denoted as $O_X$, at the first or the fourth character of the succession of eight characters without placing any restrictions on the succession of eight characters. In some situations, this allows the 'Ordered Set' character to be placed anywhere in the succession of eight characters, for example, even within a packet to provide a fast in-band communication. In an exemplary embodiment, the fast in-band communication represents a four-byte communication, one-byte for 'Ordered Set' character and three bytes for a message. This allows for other combinations of characters, for example, $D_0$ $D_1$ $T_2$ $C_3$ $O_4$ $D_5$ $D_6$ $D_7$, which are not possible under the I.E.E.E. 802.3 communication protocol.

It should be noted the Ethernet frame structure 300, as discussed above in FIG. 3, does not include any of the 'start characters', denoted as $S_X$; therefore, those combinations of the characters in the I.E.E.E. 802.3 communication protocol that include the 'start character', denoted as $S_X$, are not utilized by the encoding circuitry 502 in an exemplary embodiment.

In a first arrangement of the succession of eight characters, the one or more input characters 550 include only 'data type' characters. In this first arrangement, the encoding circuitry 502 encodes the 'data type' characters in accordance with the line coding scheme, such as described in the I.E.E.E. 802.3 communication protocol to provide an example, to provide a block of the 'data type' characters. Thereafter, the encoding circuitry 502 appends a header to the block of the 'data type' characters to provide the one or more encoded characters 554. The header, such as a Synchronization (SYNC) Code as described in the I.E.E.E. 802.3 communication protocol, can be used to indicate a format of block of the 'data type' characters.

Alternatively, in a second arrangement of the succession of eight characters, the one or more input characters 550 include only 'control type' characters or a combination of the 'control type' characters and the 'data type' characters. In this second arrangement, the encoding circuitry 502 encodes the 'data type' characters in accordance with the line coding scheme, such as described in the I.E.E.E. 802.3 communication protocol to provide an example, to provide a block of the 'control type' and/or the 'data type' characters. Thereafter, the encoding circuitry 502 appends a header to the block of the 'control type' and/or the 'data type' characters to provide the one or more encoded characters 554. The header, such as the SYNC Code as described in the I.E.E.E. 802.3 communication protocol and a Block Type Field, can be used to indicate a format of block of the 'control type' and/or the 'data type' characters.

For example, the I.E.E.E. 802.3 communication protocol describes an eight-bit conventional Block Type Field to describe the format of the block of the 'control type' and/or the 'data type' characters. These eight-bits of the conventional Block Type Field are used to identify one of the fifteen combinations for the 'control type' and/or the 'data type' characters as permitted in the I.E.E.E. 802.3 communication protocol. The Block Type Field implemented by the encoding circuitry 502 can support the fifteen combinations for the 'control type' and/or the 'data type' characters as permitted in the I.E.E.E. 802.3 communication protocol. In some situations, the combinations for the 'control type' and/or the 'data type' characters can be extend beyond those permitted in the I.E.E.E. 802.3 communication protocol. For example, accommodating the 'Ordered Set' character, denoted as $O_X$, anywhere within the succession of eight characters as described above can recognize other combinations for the 'control type' and/or the 'data type' characters. In an exemplary embodiment, the extension of block types is accomplished by using some of the remaining bits of the Block Type Field. In an exemplary embodiment, the Block Type Field can be compressed via transcoding as described in the I.E.E.E. 802.3 communication protocol to support RS FEC.

The scrambling circuitry 504 scrambles the one or more encoded characters 554 in accordance with a scrambling code to provide one or more scrambled character-types 556. For example, the scrambling circuitry 504 can implement the following scrambler polynomial:

$$G(x)=1+x^{39}+x^{58} \quad (1)$$

as described in the I.E.E.E. 802.3 communication protocol.

The optional transcoding circuitry 506 transcodes the one or more scrambled character-types 556 to provide the one or more output characters 552. The optional transcoding circuitry 506 adjusts a format of the one or more scrambled character-types 556 from a first format, such as a sixty-six bit width to provide an example, to a second format, such as sixteen bit width to provide an example, to provide the one or more output characters 552. In an exemplary embodiment, the optional transcoding circuitry 506 transcodes four 66-bit scrambled blocks to a 257-bit transcoded block.

CONCLUSION

The Detailed Description referred to accompanying figures to illustrate exemplary embodiments consistent with the disclosure. References in the disclosure to "an exemplary embodiment" indicates that the exemplary embodiment described include a particular feature, structure, or characteristic, but every exemplary embodiment can not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The exemplary embodiments described within the disclosure have been provided for illustrative purposes, and are not intend to be limiting. Other exemplary embodiments are possible, and modifications can be made to the exemplary embodiments while remaining within the spirit and scope of the disclosure. The disclosure has been described with the aid of functional building characters illustrating the implementation of specified functions and relationships thereof. The boundaries of these functional building characters have been arbitrarily defined herein for the convenience of the description. Alternate boundaries can be defined so long as the specified functions and relationships thereof are appropriately performed.

The Detailed Description of the exemplary embodiments fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based on the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. A wired communication device, comprising:
   media access control (MAC) circuitry configured to:
      frame a plurality of data packets to provide a plurality of framed data packets, each data packet of the plurality of data packets being separated from an adjacent data packet of the plurality of data packets by a corresponding interpacket gap (IPG) of a plurality of IPGs,
      determine a first IPG duration from among a plurality of IPG durations corresponding to a first IPG of the plurality of IPGs, and
      selectively choose a second IPG duration of the plurality of IPG durations corresponding to a second IPG of the plurality of IPGs to be greater than the first IPG duration when the first IPG duration is less than an average IPG duration or to be less than the first IPG duration when the first IPG duration is greater than the average IPG duration to maintain the average IPG duration over the plurality of framed data packets; and
   physical layer (PHY) circuitry, coupled to the MAC circuitry, configured to encode the plurality of framed data packets in accordance with a line coding scheme to provide a plurality of encoded data packets.

2. The wired communication device of claim 1, wherein each of the plurality of framed data packets includes a plurality of characters, the plurality of characters of a framed data packet of the plurality of framed data packets selected from a plurality of possible combinations for the framed data packet, and
   wherein the PHY circuitry is further configured to:
      encode the framed data packet from a first number of characters to a second number of characters to provide an encoded data packet, and
      append a Block Type Field to the encoded data packet.

3. The wired communication device of claim 1, wherein the plurality of data packets do not include 'start' characters.

4. The wired communication device of claim 1, wherein the plurality of data packets do not include a Block Type Field having an alternating pattern of logical zeros and logical ones.

5. The wired communication device of claim 1, wherein the plurality of data packets do not include a start of packet delimiter (SFD) Field to indicate a start of a payload.

6. The wired communication device of claim 1, wherein the average IPG duration is four-bytes.

7. The wired communication device of claim 1, wherein the line coding scheme comprises:
   an 8b/10b line code;
   a 64b/66b line code;
   a 128b/130b line code; or
   a 128b/132b line code.

8. The wired communication device of claim 1, wherein the plurality of data packets comprises:
   a plurality of 'data-type' characters,
   wherein the plurality of IPGs comprises:
      a plurality of 'control-type' characters,
      wherein transitions from the plurality of 'data-type' characters to the plurality of 'control-type ' characters within the plurality of framed data packets indicate start positions of the plurality of IPGs, and
      wherein transitions from the plurality of 'control-type' characters to the plurality of 'data-type ' characters within the plurality of framed data packets indicate start positions of the plurality of data packets.

9. A method of operating a wired communication device, the method comprising:
   framing a plurality of data packets to provide a plurality of framed data packets, each data packet of the plurality of data packets being separated from an adjacent data packet of the plurality of data packets by a corresponding interpacket gap (IPG) of a plurality of IPGs;
   determining a first IPG duration from among a plurality of IPG durations corresponding to a first IPG of the plurality of IPGs,
   selectively choosing a second IPG duration of the plurality of IPG durations corresponding to a second IPG of the plurality of IPGs to be greater than the first IPG duration when the first IPG duration is less than an average IPG duration or to be less than the first IPG duration when the first IPG duration is greater than the average IPG duration to maintain the average IPG duration over the plurality of framed data packets; and encoding the plurality of framed data packets in accordance with a line coding scheme to provide a plurality of encoded data packets.

10. The method of claim 9, wherein each of the plurality of framed data packets includes a plurality of characters, the plurality of characters of a framed data packet of the framed data packets being recognized as being from a plurality of possible combinations for the framed data packet, and
the method further comprising:
encoding the framed data packet from a first number of characters to a second number of characters to provide an encoded data packet, and
appending a Block Type Field to the encoded data packet.

11. The method of claim 9, wherein the plurality of data packets do not include 'start' characters.

12. The method of claim 9, wherein the plurality of data packets do not include a Block Type Field having an alternating pattern of logical zeros and logical ones.

13. The method of claim 9, wherein the plurality of data packets do not include a start of packet delimiter (SFD) Field to indicate a start of a payload.

14. The method of claim 9, wherein the average IPG duration is four-bytes.

15. The method of claim 9, wherein the line coding scheme comprises:
an 8b/10b line code;
a 64b/66b line code;
a 128b/130b line code; or
a 128b/132b line code.

16. A wired communication device, comprising:
media access control (MAC) circuitry configured to separate a plurality of data packets by a plurality of inter-packet gaps (IPGs) to provide a plurality of framed data packets, wherein a first IPG duration of a first IPG of the plurality of IPGs is greater than a second IPG duration of a second IPG of the plurality of IPGs when the second IPG duration is less than an average IPG duration or less than the second IPG duration when the second IPG duration is greater than the average IPG duration; and
physical layer (PHY) circuitry, coupled to the MAC circuitry, configured to encode the plurality of framed data packets in accordance with a line coding scheme to provide a plurality of encoded data packets,
wherein each of the plurality of framed data packets includes a plurality of characters, the plurality of characters of a framed data packet of the plurality of framed data packets being selected from a plurality of possible combinations for the framed data packet, and
wherein the PHY circuitry is further configured to encode the framed data packet from a first number of characters to a second number of characters to provide an encoded data packet.

17. The wired communication device of claim 16, wherein the framed data packet comprises:
a plurality of 'control-type' characters; or
a combination of 'control-type' characters and 'data-type' characters.

18. The wired communication device of claim 16, wherein the framed data packet comprises eight successive characters, and
wherein the eight successive characters comprises:
an 'Ordered Set' character within the second, third, fourth, sixth, seventh, or eighth character of the eight successive characters.

19. The wired communication device of claim 16, wherein the PHY circuitry is further configured to append a Block Type Field to the encoded data packet.

20. The wired communication device of claim 19, wherein a length of the Block Type Field is four-bits to accommodate fifteen possible combinations.

* * * * *

UNITED STATES PATENT AND TRADEMARK OFFICE
CERTIFICATE OF CORRECTION

PATENT NO. : 10,148,284 B2
APPLICATION NO. : 15/189696
DATED : December 4, 2018
INVENTOR(S) : Bansal et al.

Page 1 of 1

It is certified that error appears in the above-identified patent and that said Letters Patent is hereby corrected as shown below:

On the Title Page

Item (57) Abstract, Line 11, replace "that is efficiently represents different" with -- that efficiently represents different --.

Signed and Sealed this
Fourteenth Day of April, 2020

Andrei Iancu
*Director of the United States Patent and Trademark Office*